(12) United States Patent
Shin et al.

(10) Patent No.: US 7,928,437 B2
(45) Date of Patent: Apr. 19, 2011

(54) THIN FILM TRANSISTOR SUBSTRATE AND METHOD OF MANUFACTURE

(75) Inventors: Kyoung-Ju Shin, Hwaseong-si (KR); Chong-Chul Chai, Seoul (KR); Mee-Hye Jung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 369 days.

(21) Appl. No.: 11/955,252

(22) Filed: Dec. 12, 2007

(65) Prior Publication Data
US 2008/0135846 A1 Jun. 12, 2008

(30) Foreign Application Priority Data

Dec. 12, 2006 (KR) .................. 10-2006-0125950

(51) Int. Cl.
*H01L 29/04* (2006.01)
(52) U.S. Cl. .............. 257/59; 257/72; 257/E27.001
(58) Field of Classification Search .............. 257/59, 257/72, E27.001
See application file for complete search history.

(56) References Cited

U.S. PATENT DOCUMENTS

| | | | | |
|---|---|---|---|---|
| 6,825,497 B2* | 11/2004 | Lai | ............................... | 257/72 |
| 6,838,700 B2* | 1/2005 | Trainor et al. | .................. | 257/72 |
| 6,972,819 B2* | 12/2005 | Lee et al. | ..................... | 349/149 |
| 7,005,707 B2* | 2/2006 | Lai | ............................... | 257/355 |
| 7,532,265 B2* | 5/2009 | Tsai et al. | ..................... | 349/40 |
| 7,551,240 B2* | 6/2009 | Tsai et al. | ..................... | 349/40 |
| 7,629,614 B2* | 12/2009 | Liao | ............................... | 257/72 |
| 2002/0038893 A1* | 4/2002 | Wong | ............................. | 257/359 |
| 2003/0030054 A1* | 2/2003 | Hector et al. | .................. | 257/72 |
| 2005/0224793 A1* | 10/2005 | Chang et al. | .................. | 257/59 |
| 2006/0038181 A1* | 2/2006 | Tseng | ............................. | 257/72 |

FOREIGN PATENT DOCUMENTS

| | | |
|---|---|---|
| JP | 2004-342923 | 12/2004 |
| KR | 1020060019270 | 3/2006 |
| KR | 1020060080761 | 7/2006 |

OTHER PUBLICATIONS

Machine Translation of KR 10-2006-0019270.*

* cited by examiner

*Primary Examiner* — Eugene Lee
*Assistant Examiner* — Anthony Ho
(74) *Attorney, Agent, or Firm* — Innovation Counsel LLP

(57) ABSTRACT

A thin film transistor ("TFT") substrate in which the size of a pixel TFT formed in a display area is reduced using a single slit mask, and the length of the channel area of a protection TFT constituting an electrostatic discharge protection circuit formed in a non-display area is formed larger than that of the pixel TFT using the same mask pattern. The TFT substrate includes a signal line and a discharge line formed on a substrate, a signal supply pad formed on one end of the signal line to supply a signal to the signal line, and an electrostatic discharge protection circuit including at least one protection TFT including a plurality of channels formed between the signal supply pad and the discharge line and/or between the signal line and the discharge line.

8 Claims, 14 Drawing Sheets

A

B

THIN FILM TRANSISTOR SUBSTRATE AND METHOD OF MANUFACTURE

CROSS-REFERENCE TO RELATED APPLICATION(S)

The present application claims priority to Korean Patent Application No. 2006-0125950, filed on Dec. 12, 2006, the disclosure of which is incorporated herein by reference in its entirety.

BACKGROUND OF THE INVENTION

1. Field of the Invention

The present disclosure relates to a liquid crystal display device and, more particularly, to a device having an improved thin film transistor ("TFT") substrate.

2. Description of the Related Art

A liquid crystal display ("LCD") device includes a liquid crystal panel displaying an image, a panel driving unit driving the liquid crystal panel, and a light source providing light to the liquid crystal panel. The panel driving unit includes a gate driving unit driving gate lines and a data driving unit driving data lines. The gate driving unit supplies a scan signal to the gate lines sequentially, and the data driving unit supplies a data voltage to the data lines when the scan signal is applied.

The liquid crystal panel includes a TFT substrate on which a TFT array is formed, a color filter substrate on which a color filter array is formed, and liquid crystals formed between the TFT substrate and the color filter substrate.

The color filter substrate includes a black matrix defining a sub-pixel area, and preventing light leakage, a color filter formed in the sub-pixel area and displaying red, green or blue color, and a common electrode receiving a common voltage.

The TFT substrate includes gate lines and data lines intersecting each other, TFTs formed at intersections between the gate lines and the data lines and connected to the gate lines and the data lines, and pixel electrodes connected to the TFTs. Moreover, the TFT substrate includes an ESD protection circuit protecting the TFT array. The ESD protection circuit includes at least one protection TFT, and the channel length of the protection TFT constituting the ESD protection circuit is formed large.

The TFT substrate is formed using a 4-mask process, in which a gate insulating layer, a semiconductor layer, an ohmic contact layer and a data pattern are formed using a single half-tone or slit mask to form a channel of the TFT.

However, the slit mask and the halftone mask are expensive and the slit mask has a high defect rate due to differences in the amount of light exposure in the slit area. Furthermore, it is very difficult using a slit mask to form a uniform channel of less than 3 μm.

SUMMARY OF THE INVENTION

The present invention provides a thin film transistor ("TFT") substrate in which a channel of a pixel TFT is formed using a single slit mask in a 4-mask process that reduces the size of the pixel TFT, thus improving its aperture ratio and preventing defects of the channel area.

The present invention provides a TFT substrate including an electrostatic discharge ("ESD") protection circuit having at least one protection TFT formed with a plurality of channels in the same process used for forming the channels of the pixel TFTs.

In an aspect, the present invention provides a TFT substrate including: a signal line and a discharge line formed on a substrate; a signal supply pad formed on one end of the signal line to supply a signal to the signal line; and an ESD protection circuit including at least one protection TFT having a plurality of channels formed between the signal supply pad and the discharge line and/or between the signal line and the discharge line.

Preferably, the protection TFT includes: a first gate electrode; a gate insulating layer covering the first gate electrode; a first semiconductor layer and a first ohmic contact layer formed on the gate insulating layer, wherein the first semiconductor layer and a first ohmic contact layer overlap the first gate electrode; a first source electrode and a first drain electrode formed facing each other on the first ohmic contact layer; and at least one floating electrode formed on the first ohmic contact layer between the first source electrode and the first drain electrode.

Suitably, the signal line includes: a gate line supplying a gate-on voltage and a gate-off voltage; and a data line supplying a data voltage, wherein the data line is insulated from the gate line.

The discharge line includes at least one of a storage signal supply line receiving a storage voltage, a test line receiving a test signal for testing the signal line, and a floating line.

The TFT substrate in accordance with the present invention further includes: a pixel TFT electrically connected to the gate line and the data line; and a pixel electrode connected to the pixel TFT.

The pixel TFT includes: a second gate electrode connected to the gate line; the gate insulating layer covering the second gate electrode; a second source electrode connected to the data line; a second drain electrode formed facing the second source electrode; a second semiconductor layer formed between the second source electrode, the second drain electrode and the gate insulating layer, to form a second channel; and a second ohmic contact layer formed between the second semiconductor layer and the second source electrode, and between the second semiconductor layer and the second drain electrode.

The sum of lengths of the plurality of channels formed in the protection TFT is greater than the channel length of the pixel TFT.

The TFT substrate in accordance with the present invention further includes: a gate driving unit integrated into the substrate to provide the gate-on voltage and the gate-off voltage to the gate line; the signal supply pad providing a driving signal to the gate driving unit; the discharge line formed between the signal supply pad and the gate driving unit; and the electrostatic discharge protection circuit formed between the signal supply pad and the discharge line.

In another aspect of the present invention, a method of manufacturing a TFT substrate includes: forming a first conductive layer on a substrate; forming a first gate electrode, a discharge line and a gate pad electrode in a non-display area, and a gate pattern including a gate line connected to the gate pad electrode and a second gate electrode connected to the gate line in a display area by patterning the first conductive layer; stacking a gate insulating layer, a semiconductor layer, an ohmic contact layer, and a second conductive layer on the gate pattern; forming a data pad electrode, a first source electrode, a first drain electrode facing the first source electrode, at least one floating electrode between the first source electrode and the second drain electrode, and a discharge line in the non-display area, and a data pattern including a data line connected to the data pad electrode, a second source electrode connected to the data line and a second drain electrode facing the second source electrode in the display area by patterning the second conductive layer; and forming a protection TFT including a plurality of channels by etching the ohmic contact layer between the first source electrode, the first drain electrode and the floating electrode, and then forming a pixel TFT having a single channel by etching the ohmic contact layer between the second source electrode and the second drain electrode.

The process of forming the data pattern includes: forming a photoresist on the second conductive layer; exposing the photoresist through a mask including a blocking area formed in the areas where the first and second source electrodes, the first and second drain electrodes, the data line and the floating electrode are to be formed. A single slit area is formed where channels are to be formed, and a transmission area is formed in the remaining area. A photoresist pattern is formed in an area corresponding to the blocking area, and a remaining photoresist pattern is formed in an area corresponding to the single slit area by developing the photoresist; etching the substrate on which the photoresist pattern and the remaining photoresist pattern are formed; exposing the second conductive layer corresponding to the channel area by ashing the remaining photoresist; and forming the first and second source electrodes, the first and second drain electrodes, the data line, the discharge line and the floating electrode by etching the substrate on which the photoresist pattern is formed. The single slit area in the display area has a slit width which is the same as that of the single slit area in the non-display area which may be in the range of about 1.9 µm to about 2.6 µm. The channel length of the non-display area may be greater than that of the display area.

The method of manufacturing the TFT substrate in accordance with the present invention further includes: forming a passivation layer protecting the protection TFT and the pixel TFT; and forming a pixel electrode connected to the pixel TFT, a gate pad connected to the gate pad electrode, and a data pad connected to the data pad electrode on the passivation layer.

At least one process of forming the gate pattern and forming the data pattern further includes forming a discharge line connected to the protection TFT and forming a test line providing a test signal to the gate line and the data line, respectively.

The method of manufacturing the TFT substrate in accordance with the present invention further includes forming the protection TFT between the test line and the gate pad or between the test line and the data pad.

Preferably, the method of manufacturing the TFT substrate in accordance with the present invention further includes: forming a gate driving unit integrated into the substrate to provide a gate-on voltage and a gate-off voltage to the gate line; forming a signal supply line providing a driving signal to the gate driving unit; and forming a signal supply pad on one end of the signal supply line to receive the driving signal.

A discharge line may be formed between the signal supply pad and the gate driving unit and a protection TFT may be formed connected between the signal supply line and the discharge line.

DETAILED DESCRIPTION

Detail operations and exemplary embodiments of the invention are described more fully hereinafter with reference with the accompanying drawings.

Figure 1:
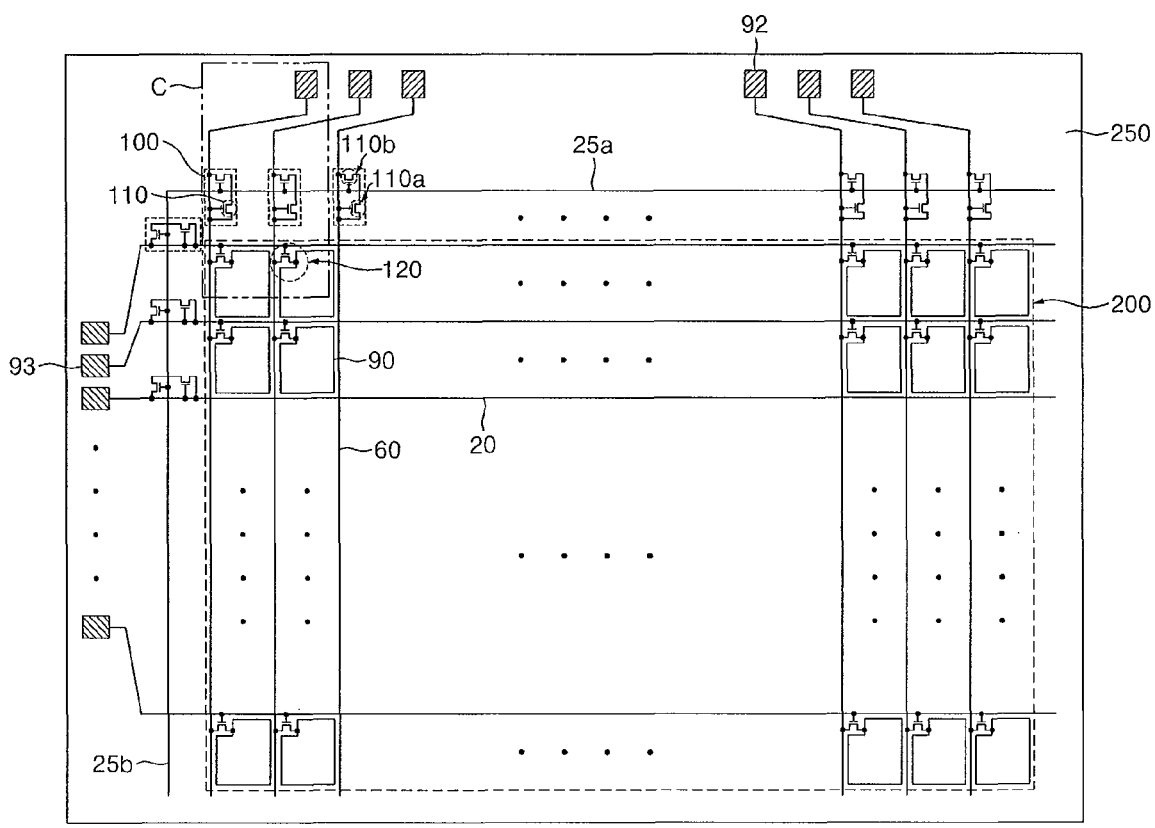
FIG. 1 is a plan view showing a thin film transistor ("TFT") substrate in accordance with a first embodiment of the present invention.
Figure 2:
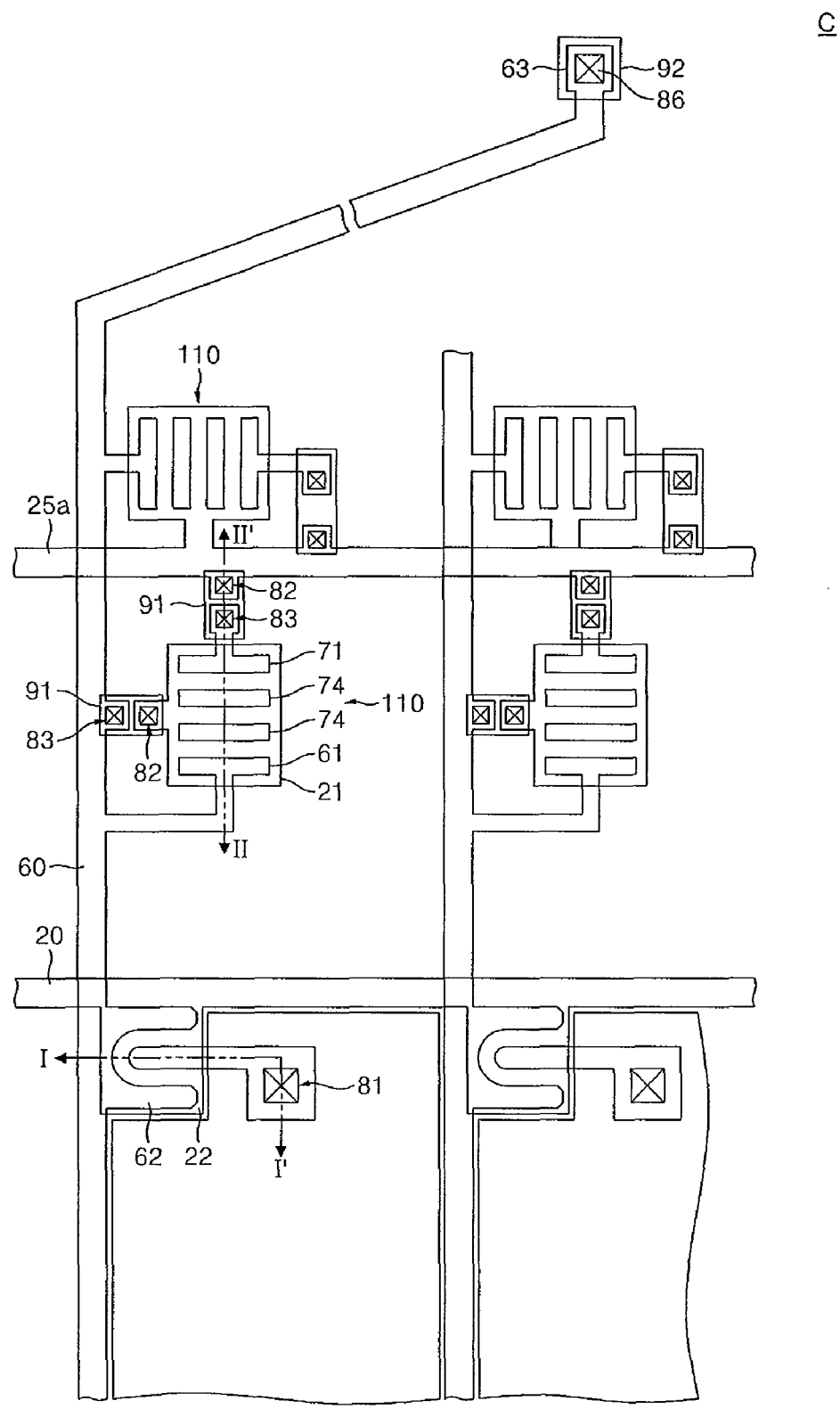
FIG. 2 is an enlarged view of area C shown in FIG. 1.
Figure 3:
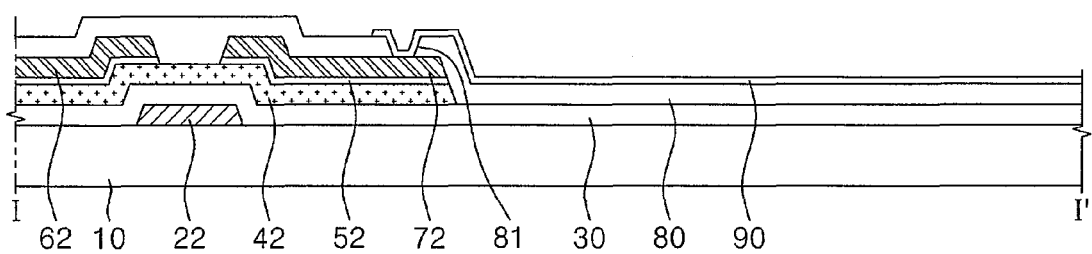
FIG. 3 is a cross-sectional view taken along lines I-I' and II-II' of the TFT substrate shown in FIG. 2.
Figure 3:
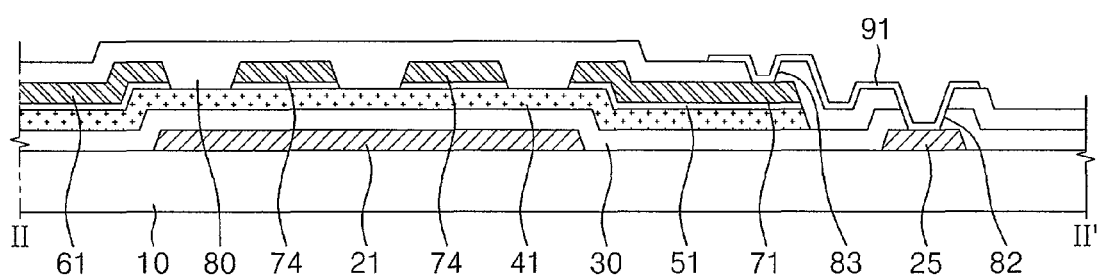

FIG. 1 is a plan view showing a thin film transistor ("TFT") substrate in accordance with a first embodiment of the present invention, FIG. 2 is an enlarged view of area C shown in FIG. 1, and FIG. 3 is a cross-sectional view taken along lines I-I' and II-II' of the TFT substrate shown in FIG. 2.

Referring to FIGS. 1, 2, and 3, a TFT substrate 10 in accordance with a first embodiment of the present invention includes a display area 200 and a non-display area 250 surrounding the display area 200. The display area 200 includes a gate line 20 and a data line 60 which are insulated from each other, a pixel TFT 120 electrically connected to the gate line 20 and the data line 60, and a pixel electrode 90 connected to the pixel TFT 120.

The non-display area 250 includes a signal supply pad including a gate pad 93 and a data pad 92 formed at each end of the gate line 20 and the data line 60 to receive signals from the outside, a discharge line 25 formed between the signal supply pad and the display area 200, and an electrostatic discharge ("ESD") protection circuit 100 bypassing static electricity, introduced into the signal supply pad, to the discharge line 25.

The ESD protection circuit 100 includes at least one protection TFT 110 including a first gate electrode 21, a gate insulating layer 30 covering the first gate electrode 21, a first semiconductor layer 41 formed overlapping the first gate electrode 21 on the gate insulating layer 30, a first source electrode 61 and a first drain electrode 71 formed facing each other on the first semiconductor layer 41, and a floating electrode 74 formed between the first source electrode 61 and the first drain electrode 71.

The gate line 20 and the data line 60 are formed on the substrate 10 to intersect each other along the gate insulating layer 30 interposed therebetween. A gate pad electrode and a data pad electrode 63 receiving signals from the outside are formed at each end of the gate line 20 and the data line 60.

The gate line 20 provides a scan signal supplied from the outside to the pixel TFT 120 through the gate pad 93. The gate pad electrode is connected to the gate pad 93 through a gate contact hole.

The data line 60 provides a data voltage supplied from the outside to the pixel TFT 120 through the data pad 92 every time when the scan signal is supplied. The data pad electrode 63 is connected to the data pad 92 through a data pad contact hole 86.

The pixel TFT 120 includes a second gate electrode 22 connected to the gate line 20, the gate insulating layer 30 covering the second gate electrode 22, a second semiconductor layer 42 overlapping the second gate electrode 22 on the gate insulting layer 30 to form a channel area, a second ohmic contact layer 52 formed on the second semiconductor layer 42, a second source electrode 62 connected to the data line 60, and a second drain electrode 72 facing the second source electrode 62. The pixel TFT 120 is connected to the pixel electrode 90 through a pixel contact hole 81 exposing the second drain electrode 72.

The pixel electrode 90 is connected to the pixel TFT 120 to charge a data voltage supplied from the data line 60 each time the pixel TFT 120 is turned on.

The discharge line 25 is formed between the display area 200 and the gate and data pads 93 and 92. The discharge line 25 includes a second discharge line 25b formed between the gate pad 93 and the display area 200 to prevent any static electricity discharge from the gate pad 93, and a first discharge line 25a formed between the data pad 92 and the display area 200 to prevent any static electricity discharge from the data pad 92. The second discharge line 25b may be formed of the same metal as the data line 60 and is insulated from the gate line 20. The first discharge line 25a may be formed of the same metal as the gate line 20 and is insulated from the data line 60. The first and second discharge lines 25a, 25b are usually floating.

A storage voltage may be supplied to the discharge line 25. That is, the ESD protection circuit 100 may be connected to a storage line supplying the storage voltage without forming the discharge line 25.

The ESD protection circuit 100 is connected between the discharge line 25 and the signal lines 20 and 60 to discharge static electricity generated from the gate pad 93 and the data pad 92. The ESD protection circuit 100 comprises at least one protection TFT 110.

The protection TFT 110 includes the first gate electrode 21, the first semiconductor layer 41 formed overlapping the first gate electrode 21 on the gate insulating layer 30, a first ohmic contact layer 51 formed on the first semiconductor layer 41, the first source electrode 61 and the first drain electrode 71 formed facing each other on the first ohmic contact layer 51, and a floating electrode 74 formed between the first source electrode 61 and the first drain electrode 71. Accordingly, a channel is formed between the first source electrode 61 and the floating electrode 74, and a channel is formed between the floating electrode 74 and the first drain electrode 71. If a plurality of floating electrodes is formed, a channel may be formed between the floating electrodes 74. Thus, a first TFT including the first gate electrode 21, the first source electrode 61 and the floating electrode 74, a second TFT including the first gate electrode 21 and the first drain electrode 71, and a third TFT including the first gate electrode 21 and the plurality of floating electrodes 74 are arranged equivalently in series. Accordingly, a channel length L of the protection TFT 110 is the sum of lengths L of channels formed in the respective first and second and third TFTs. The current characteristics of the protection TFT 110 can be calculated by the following Equation 1.

Equation 1 shows the current characteristics in accordance with a channel width W and a channel length L of the TFT.

$$Ion = \frac{W}{L}\mu C i V s d \left(V g - V t h - \frac{V s d}{2}\right), \quad V s d \leq \frac{V g - V t h}{2} \quad \text{[Equation 1]}$$

wherein W is a channel width, L is a channel length, μ is a mobility, Ci is an electric capacitance of a channel per unit area, Vg is a gate-on voltage, Vth is a threshold voltage, and Vsd is a voltage between a source electrode and a drain electrode.

The drain current Ion of the TFT is determined by W/L. If the channel width W is set larger and the channel length L is set smaller, the drain current Ion increases thereby improving the turn-on characteristics of the TFT. If the channel width W is set larger and the channel length L is set smaller, the electric capacitance Ci increases and the turn-on characteristics of the TFT are further improved. In other words, if the W/L becomes larger, the current value applied to the drain electrode becomes higher with the same gate-on voltage Vg applied. However, if the channel length L increases, the W/L is reduced and the drain current Ion is reduced so that it is necessary to apply a higher gate-on voltage in order to turn on the TFT. Accordingly, it is possible to form the pixel TFT 120 and the protection TFT 110 to have characteristics different from each other using such characteristics of the TFT as shown in FIG. 4.

Figure 4:
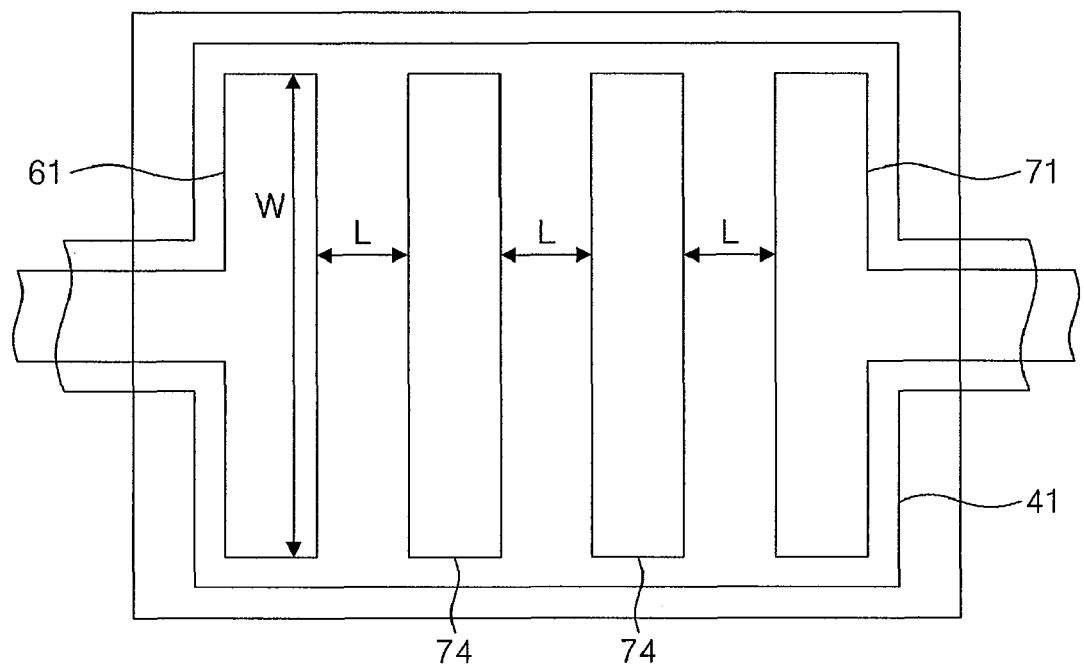
FIG. 4 is a plan view comparing channel widths and channel lengths of a protection TFT and a pixel TFT shown in FIGS. 1 and 2.
Figure 4:
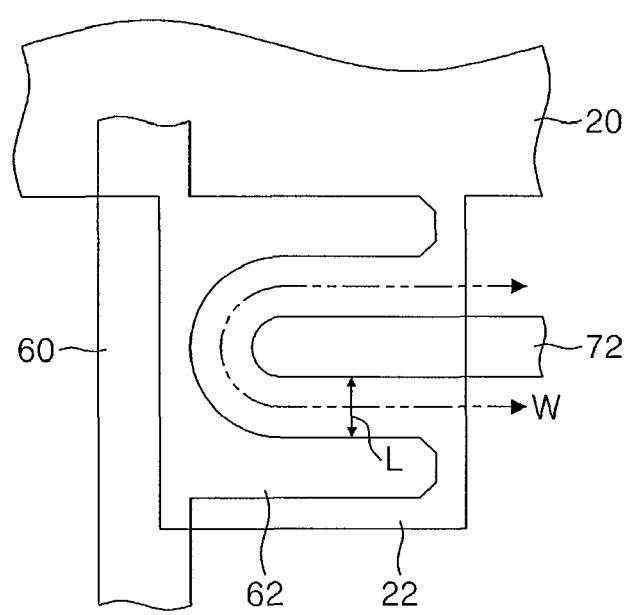
Figure 5:
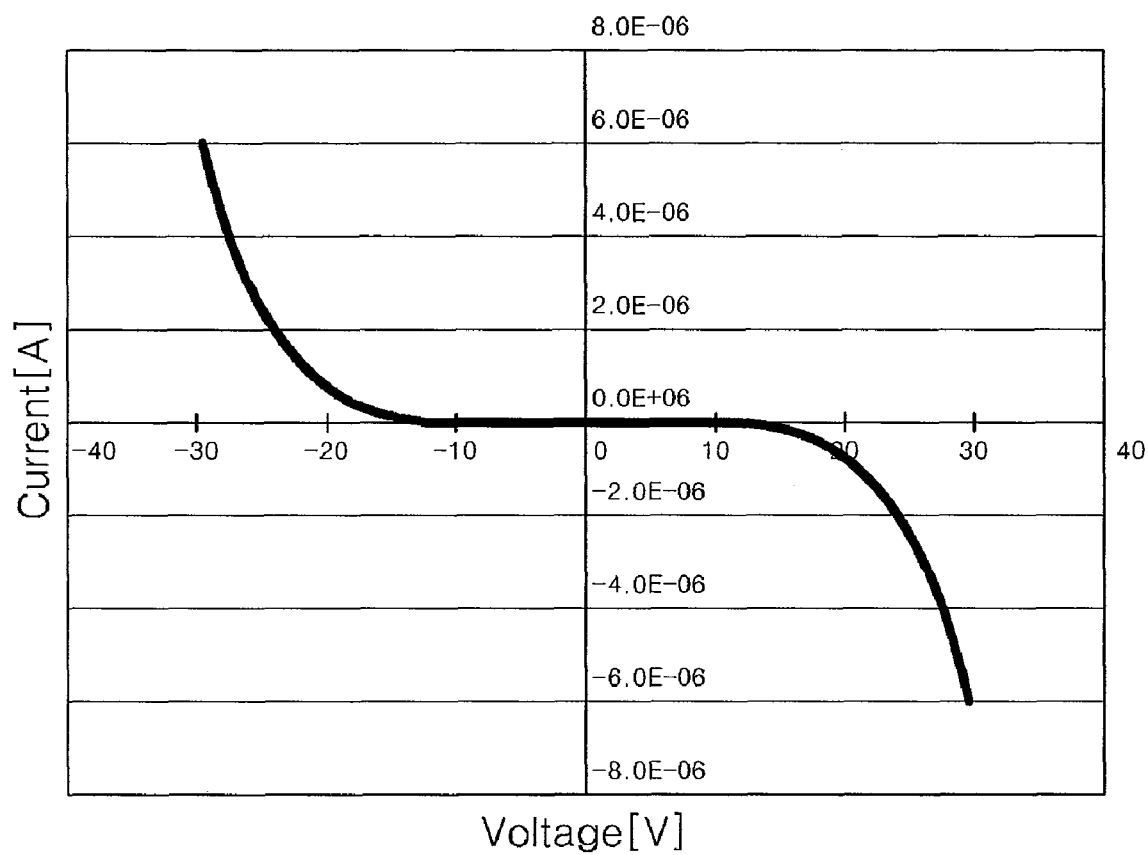
FIG. 5 is a graph showing I-V characteristics of a protection TFT formed on an electrostatic discharge ("ESD") protection circuit of a TFT substrate in accordance with the present invention.

For example, if a lower gate-on voltage Vg is supplied, the pixel TFT 120 shown in B of FIG. 4 can be turned on to charge the data voltage to the pixel electrode by increasing the W/L to increase the drain current Ion. The protection TFT 110 shown in A of FIG. 4 is operated, only if static electricity is applied, as the gate-on voltage Vg, i.e., the turn-on voltage of the protection TFT 110 becomes higher when W/L is reduced to decrease the drain current Ion. Thus, the protection TFT 110 is turned on only if the gate-on voltage Vg applied to the protection TFT 110 becomes higher, since increasing the channel length L of the protection TFT 110 decreases the turn-on current. Accordingly, as shown in FIG. 2 and, the drain current Ion becomes lower by providing the floating electrode 74 between the first source electrode 61 and the first drain electrode 71 so that the channel length L of the protection TFT is greater than that of the pixel TFT 120. As shown in an I-V graph of FIG. 5, the protection TFT 110 is turned on only if an applied voltage is high, and turned off if the applied voltage is low.

As shown in FIG. 1, the ESD protection circuit 100 includes two protection TFTs 110 formed around the discharge line 25. That is, a first protection TFT 110a is turned on by an electrostatic voltage introduced into the data line 60 or the gate line 20. When turned on, TFT 110a conducts the electrostatic voltage to the discharge line 25. A second protection TFT 110b is turned on by the electrostatic voltage applied to the discharge line 25 and thereby the electrostatic voltage is bypassed to the discharge line 25 through the second protection TFT 110b. Moreover, it is possible to provide at least two protection TFTs 110.

As the discharge line 25, a test line 26 may be used to test a display quality of the TFT substrate.

Figure 6:
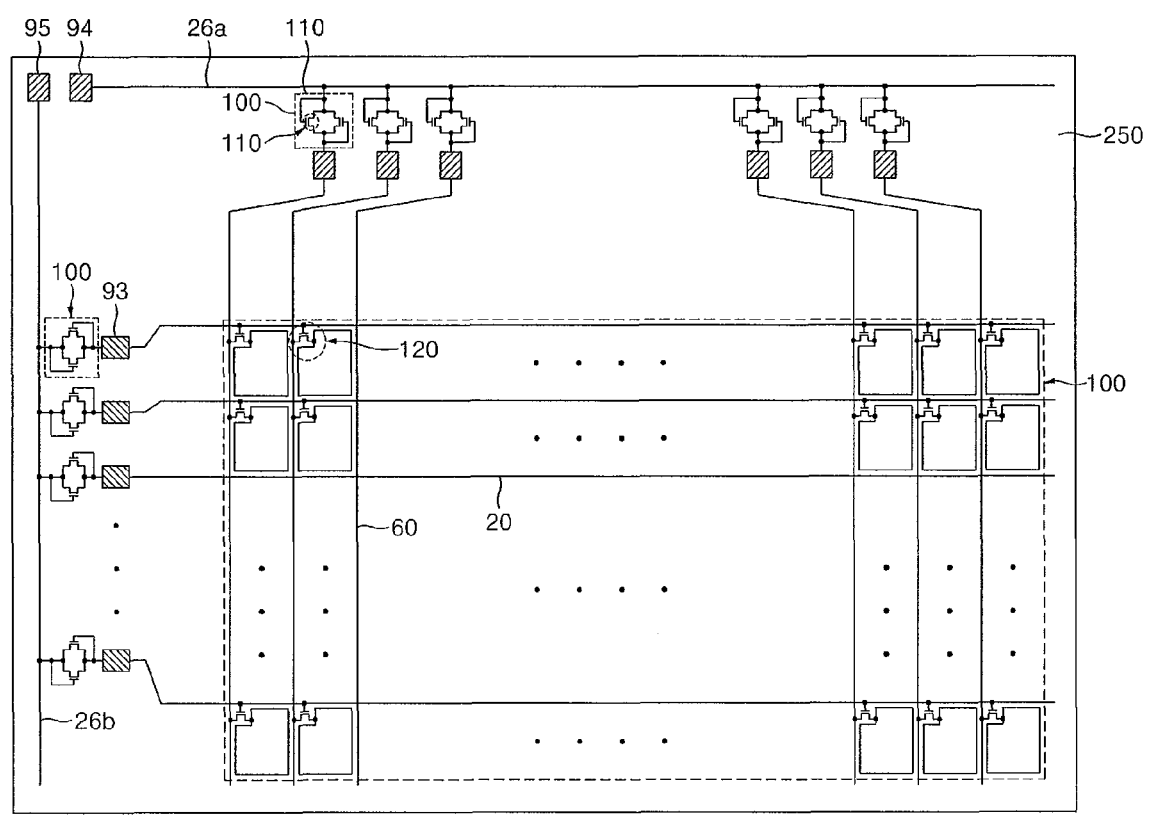
FIG. 6 is a plan view showing a TFT substrate in accordance with a second embodiment of the present invention.

FIG. 6 is a plan view showing a TFT substrate in accordance with a second embodiment of the present invention.

As shown in FIG. 6 in comparison with FIG. 2, the test line 26 is formed in the non-display area 250 of the substrate 10, and the ESD protection circuit 100 is provided between the test line 26 and the gate pad 93 and between the test line 26 and a data pad 92, respectively.

The test line 26 includes a data test line 26a applying a data test signal to the data line 60, and a gate test line 26b applying a gate test signal to the gate line 20. The data test line 26a is connected to the data pad 92, and the gate test line 26b is connected to the gate pad 93. A data test pad 94 applying the data test signal is formed on one end of the data test line 26a, and a gate test pad 95 applying the gate test signal is formed on one end of the gate test line 26b. A test voltage applied to the gate test pad 95 and the data test pad 94 to test the TFT substrate is input through a separate probe. The ESD protection circuit 100 is formed between the test line 26, the gate pad 93 and the data pad 92 to prevent static electricity generated between the probe and the test pads 94 and 95 from being applied to the gate line 20 and the data line 60.

In the ESD protection circuit 100, high voltage static electricity input from a diode wiring having the protection TFT 100 wired directions opposite to each other. A data voltage of low level and a gate-on voltage of low level are applied to the data line 60 and the gate line 20, respectively. The ESD protection circuit 100 comprising the protection TFT 100 shown in FIG. 4 is turned off if a low test voltage is applied and bypasses a high electrostatic voltage to the test line 26. Accordingly, it is possible to prevent dielectric breakdown at the intersection between the gate line 20 and the data line 60 by the static electricity applied to the test line 26, and to protect the pixel TFT 120 from the static electricity.

The protection TFT 110 may be used in an amorphous silicon gate ("ASG") wherein a gate driving unit is integrated into the substrate 10.

Figure 7:
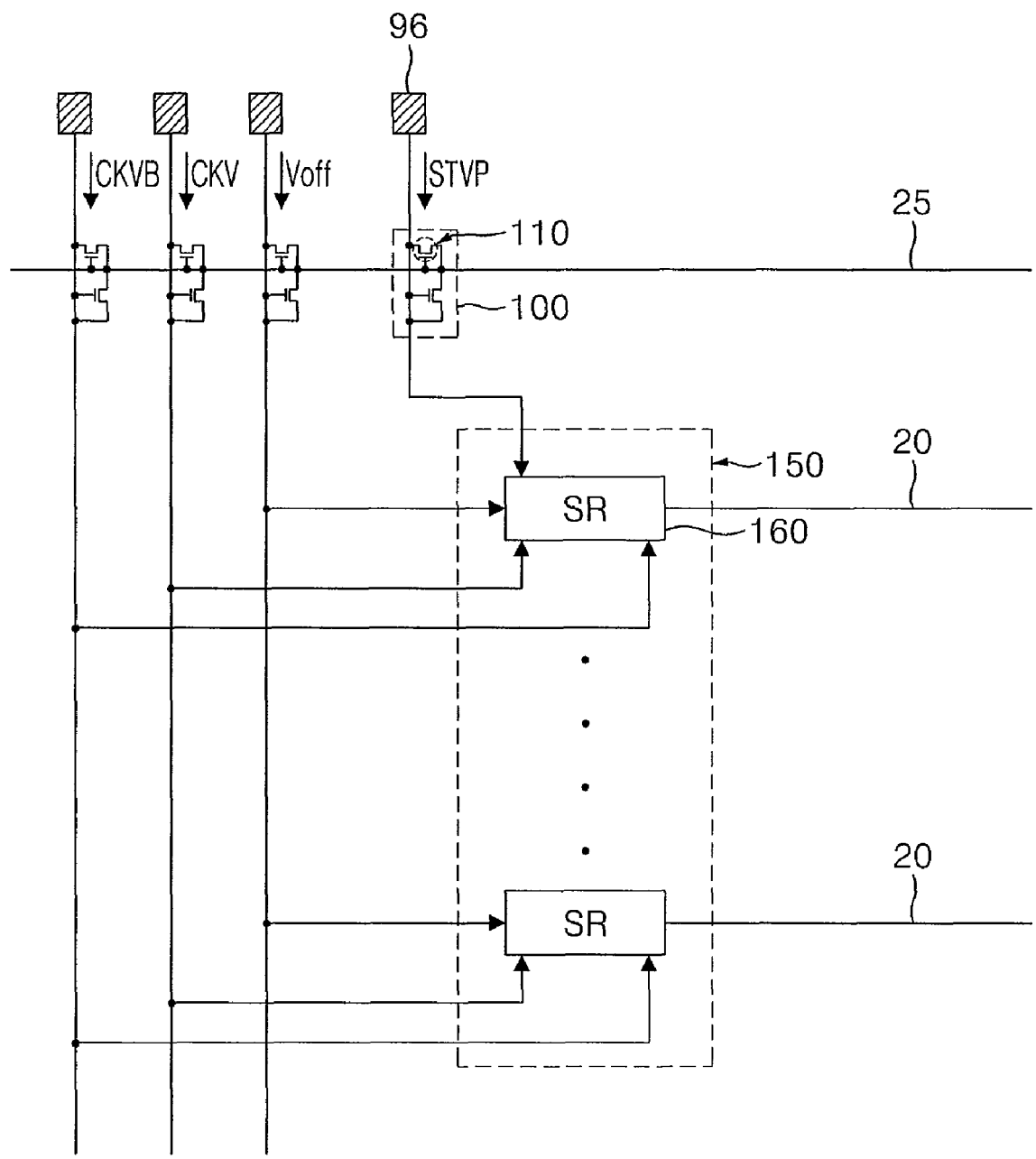
FIG. 7 is a plan view showing an amorphous silicon gate of a TFT substrate in accordance with a third embodiment of the present invention.

FIG. 7 is a plan view showing an ASG of a TFT substrate in accordance with a third exemplary embodiment of the present invention, in which the protection TFT is formed between the ASG and a signal input pad.

Referring to FIG. 7, the ESD protection circuit 100 is formed between each of clock input pads 96 of the ASG 150 and the discharge line 25. The ESD protection circuit 100 comprises at least one protection TFT 110 shown in FIG. 4.

In the ASG 150, a plurality of shift registers 160 connected to a plurality of switching elements are sequentially coupled to the respective gate lines 20 so as to supply the gate-on voltages to the respective gate lines 20. The clock input pad 96 is formed to drive such an ASG 150. The clock input pads 96 of the ASG 150 receive a clock CKV, a clock bar CKVB, a gate-off voltage Voff and a gate start pulse STVP to sequentially drive the plurality of shift registers 160 of the ASG 150. Static electricity generated by the clock input pads 96 is bypassed to the discharge line 25 through the ESD protection circuit 100 so as to protect the plurality of shift registers 160 of the ASG 150 from the static electricity.

Next, a method of manufacturing a TFT substrate in accordance with another embodiment of the present invention will be described with reference to FIGS. 8A to 8G. Here, the TFT substrate in accordance with the present invention is manufactured using a 4-mask process.

Figure 8A:
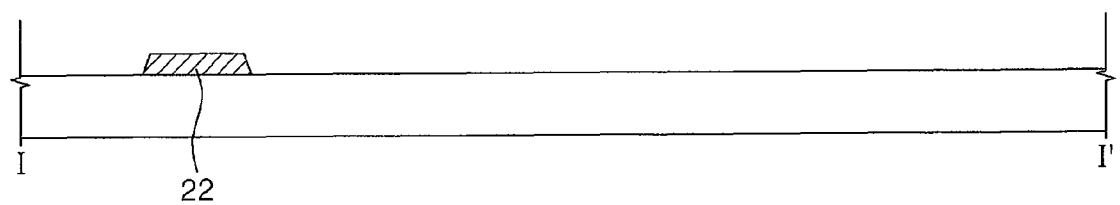
FIGS. 8A to 8G are cross-sectional views illustrating a method of manufacturing a TFT substrate through mask processes in accordance with the present invention.
Figure 8A:
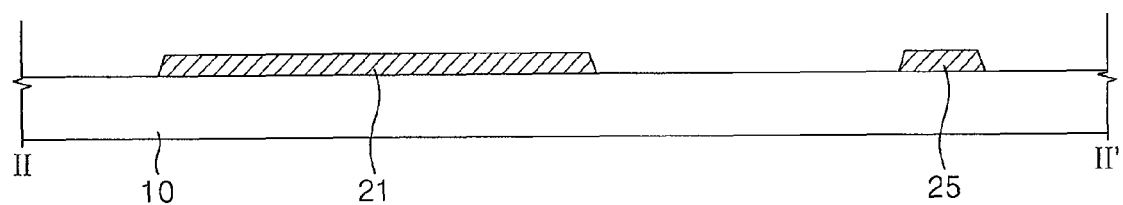

FIG. 8A is a cross-sectional view illustrating a first mask process for manufacturing the TFT substrate in accordance with the present invention.

Referring to FIG. 8A, a gate pattern is formed on a transparent substrate such as glass or plastic through a first mask process. The gate pattern includes a first gate electrode 21, a gate pad electrode and a first discharge line 25a in a non-display area 250 of the substrate 10 and a gate line 20 connected to the gate pad electrode and a second gate electrode 22 connected to the gate line 20 in a display area 200 of the substrate 10.

A first conductive layer is formed on the substrate 10 using a metal deposition process such as sputtering or the like. The first conductive layer may be formed of a metal material such as molybdenum (Mo), titanium (Ti), copper (Cu), aluminum-neodymium (AlNd), chromium (Cr), and an alloy thereof in a monolayer structure or a multilayer structure. The gate pattern including the first and second gate electrodes 21, 22, the gate line 20, and the first discharge line 25a is formed by patterning the first conductive layer through a photolithography process and an etching process using a first mask.

A test line 26 receiving a test signal may be further formed along the side line of the substrate 10. A plurality of gate electrodes and a plurality of signal lines of the ASG 150 may be further provided on one side of the substrate 10 to form a gate driving unit.

FIGS. 8B to 8E are cross-sectional views illustrating a second mask process of the method of manufacturing the TFT substrate in accordance with the present invention.

Referring to the figures, a gate insulating layer 30 is formed on the substrate 10 on which the gate pattern is formed. First and second semiconductor layers 41 and 42 are formed on the gate insulating layer 30 to form channels of a pixel TFT and a protection TFT. A first source electrode 61, a first drain electrode 71, a floating electrode 74, a data pad electrode 63 and a second discharge line 25b are formed in the non-display area 250. A data pattern including a data line 60 connected to data pad electrode 63, a second source electrode 62 connected to the data line 60, a second drain electrode 72 facing the second source electrode 62 is formed in the display area 200. Subsequently, first and second ohmic contact layers 51 and 52 are formed between the first and second semiconductor layers 41 and 42 and the data pattern.

Figure 8B:
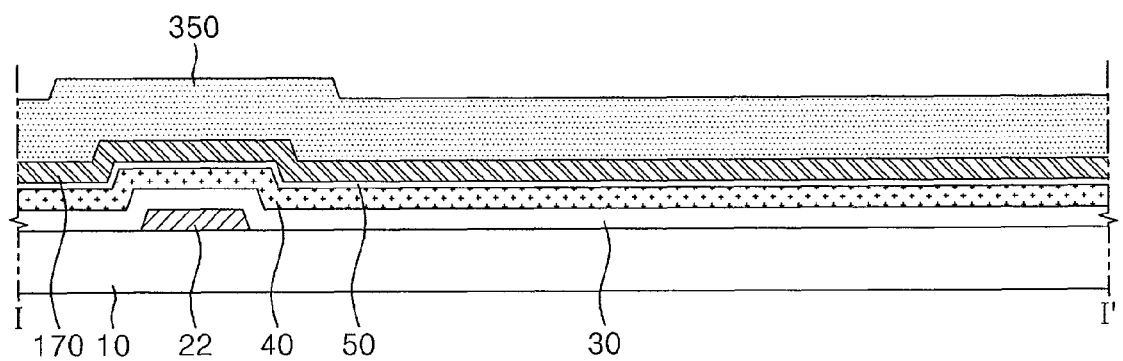
Figure 8B:
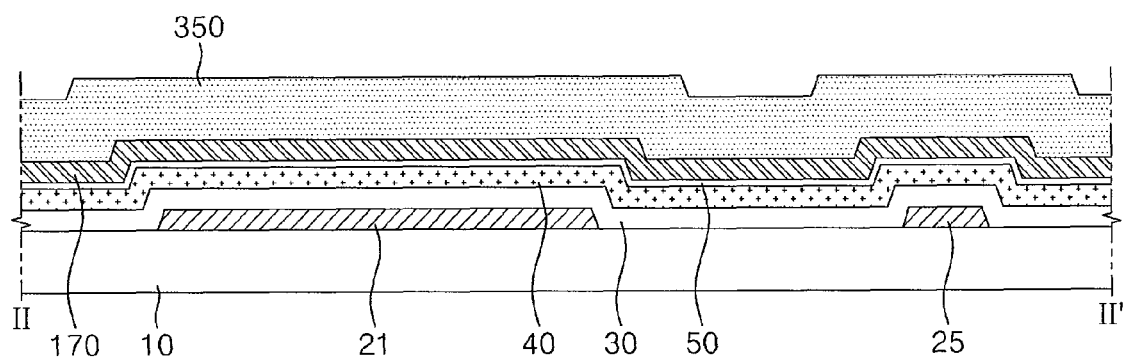

Referring to FIG. 8B, the gate insulating layer 30, an amorphous silicon layer 40, an impurity-doped amorphous silicon layer 50, and a second conductive layer 170 are sequentially formed on the substrate 10 on which the gate pattern is formed. The gate insulating layer 30, the amorphous silicon layer 40, and the impurity-doped amorphous silicon layer 50 may be formed through a plasma enhanced chemical vapor deposition PECVD process, and the second conductive layer 170 may be formed through a sputtering process.

The gate insulating layer 30 may be formed of an insulating material such as silicon oxide SiOx, silicon nitride SiNx, etc. The second conductive layer 170 may be formed of a metal material such as molybdenum Mo, titanium Ti, copper Cu, aluminum-neodymium AlNd, chromium Cr, and an alloy thereof in a monolayer structure or a multilayer structure. Next, a photoresist 350 is applied on the second conductive layer 170 and then a photoresist pattern 360 is formed by exposing and developing the photoresist 350 through a photolithography process using a single slit mask 300.

Figure 8C:
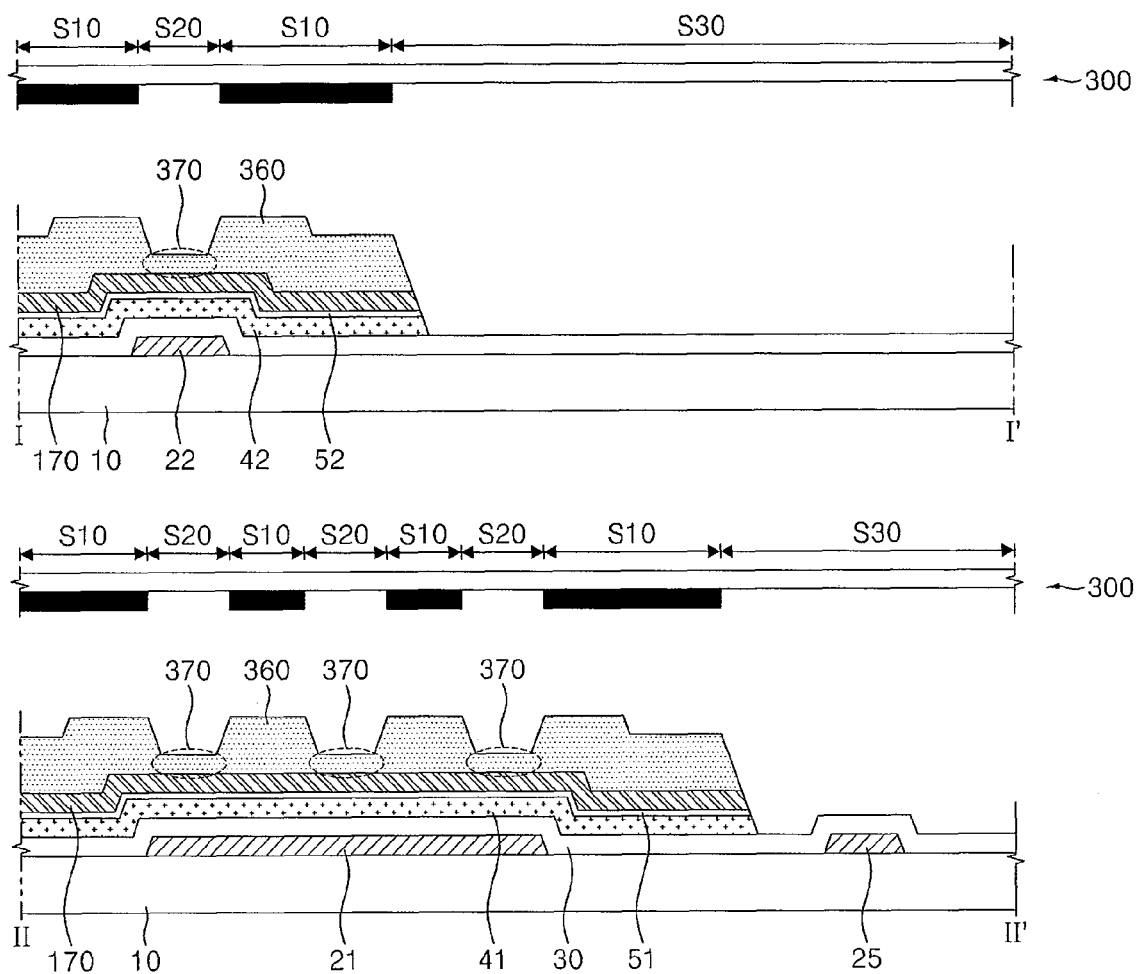

Referring to FIG. 8C, the single slit mask 300 includes a blocking area S10, a single slit area S20 and a transmission area S30. The blocking area S10 blocks ultraviolet rays to leave the photoresist pattern 360 after a developing process. The transmission area S30 transmits ultraviolet rays to remove the photoresist pattern 360 after the developing process. The single slit area S20 transmits a portion of ultraviolet rays so that the photoresist 350 remains.

In the present embodiment, the single slit areas S20 are formed at the same intervals as the pixel TFTs 120 and the protection TFTs 110 so as to provide the same exposure amount. For the protection TFTs 110, the single slit areas S20 are provided repeatedly to form the TFTs in series. It is preferable that the single slit area S20 be formed with a width in the range of about 1.9 μm to about 2.6 μm. For example, if the width of the single slit area S20 of the single slit mask 300 is formed below 1.9 μm, the first source electrode 61 and the floating electrode 74, the first drain electrode 71 and the floating electrode 74 of the protection TFT 110 may not be separated from each other, or the second source electrode 62 and the second drain electrode 72 of the pixel TFT 120 may not be separated from each other, thus causing a defect that the TFT is not formed. Whereas, if the width of the single slit area S20 is above 2.6 μm, the channel length becomes larger to adversely affect the current characteristics of the pixel TFT 120, or a remaining photoresist pattern 360 is not formed to cause a defect in a channel of the TFT. Accordingly, it is preferable that the width of the single slit area S20 be formed in the range of about 1.9 µm to about 2.6 µm. The widths of the single slit areas formed in the respective display area 200 and the non-display area 250 are the same.

A process of patterning the second conductive layer using the single slit mask 300 will be described in more detail as follows. The blocking area S10 of the single slit mask 300 is positioned in areas where the first and second semiconductor layers 41 and 42, the first and second ohmic contact layers 51 and 52 and the data pattern are to be formed to block ultraviolet rays, and thereby the photoresist pattern 360 remains after a developing process as shown in FIG. 8C. The single slit area S20 is positioned in areas where channels of the pixel TFT 120 and the protection TFT are to be formed to diffract ultraviolet rays, and thereby a photoresist pattern 370 having a thickness smaller than the photoresist pattern 360 remains after a developing process as shown in FIG. 8C. Subsequently, the transmission area S30 transmits ultraviolet rays to remove the photoresist after a developing process. Next, the second conductive layer 170 in the area where the photoresist pattern 360 is removed is etched through a first etching process. The impurity-doped amorphous silicon layer 50 and the amorphous silicon layer 40 are removed through a second etching process.

Figure 8D:
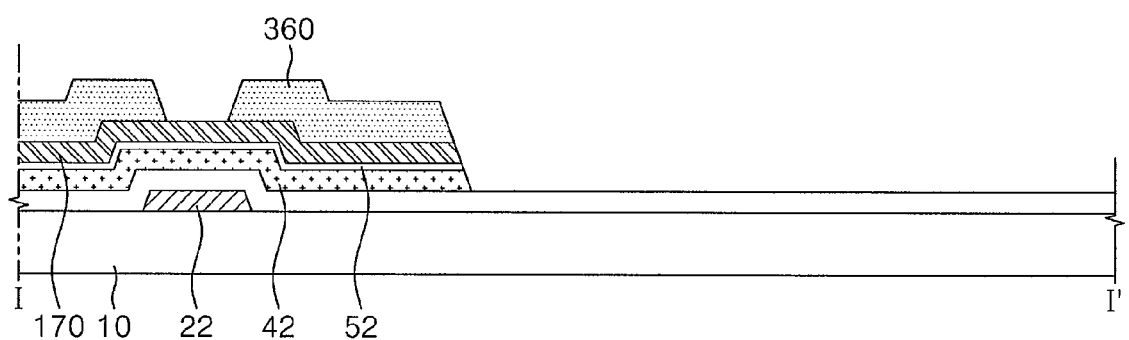
Figure 8D:
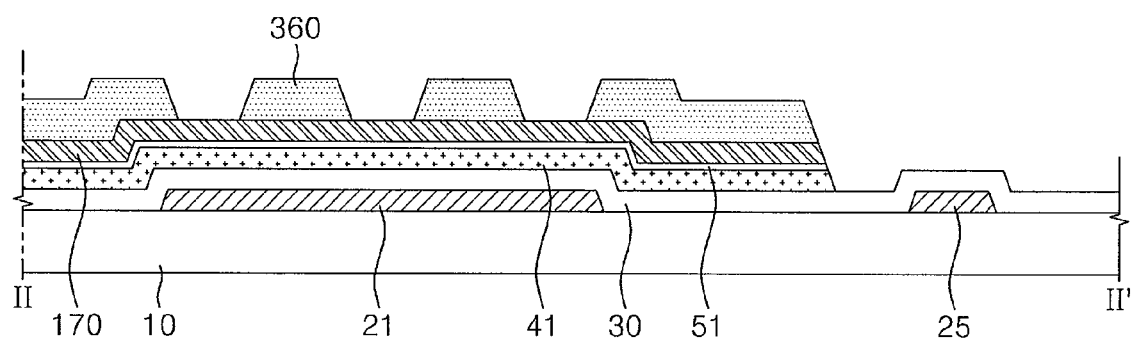
Figure 8E:
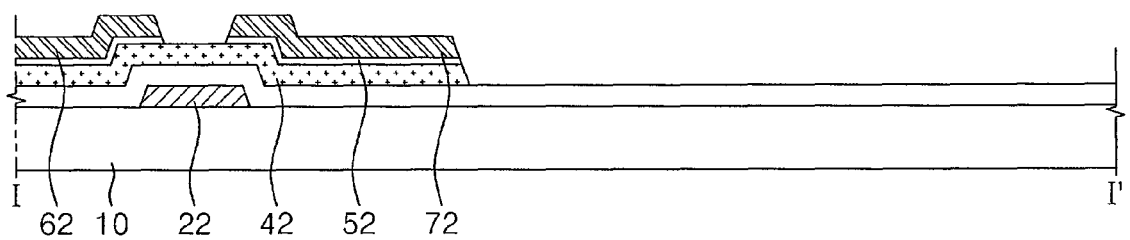
Figure 8E:
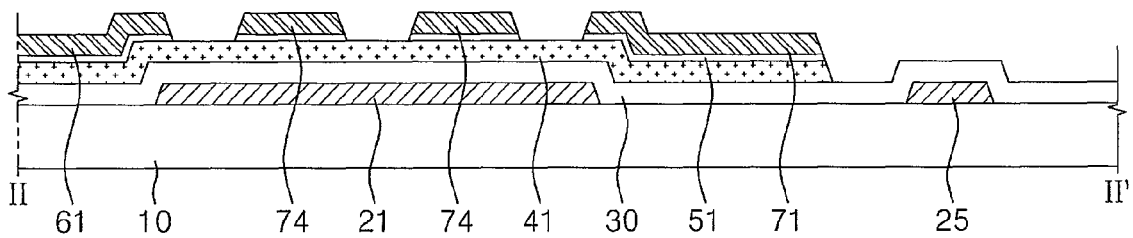

Subsequently, the photoresist pattern 360 becomes thinner by removing the remaining photoresist pattern 370 through an ashing process using oxygen plasma or the like as shown in FIG. 8D. The photoresist pattern 360 is removed as much as the thickness of the remaining photoresist pattern 370. Then, the data pattern in which the channel area is exposed is etched through a third etching process using an ashed photoresist pattern 360, and the first and second ohmic contact layers 51 and 52 in the channel area are etched through a fourth etching process. Thus, the first source electrode 61, the floating electrode 74 and the first drain electrode 71 of the protection TFT 110 are separated from each other, and the first semiconductor layer 41 is exposed. In addition, the second source electrode 62 and the second drain electrode 72 of the pixel TFT 120 are separated, and the second semiconductor layer 42 is exposed. By patterning the second conductive layer 170 through such an etching process using the photoresist pattern 360, the data pattern including the first source electrode 61, the first drain electrode 71, the floating electrode 74, the data line 60, the second discharge line 25b, the data pad electrode 63, the second source electrode 62, and the second drain electrode 72 is formed as showed in FIG. 8E. The first and second semiconductor layers 41 and 42 are exposed to form a plurality of channels of the protection TFT 110 and the pixel TFT 120.

A test line 26 may be further formed. That is, the test line 26 receiving a test signal may be further formed along the side line of the substrate 10.

When the gate driving unit is integrated on one side of the substrate 10, a data pattern such as a data pattern of the ASG 150, a signal supply line, and the like may be further formed.

Figure 8F:
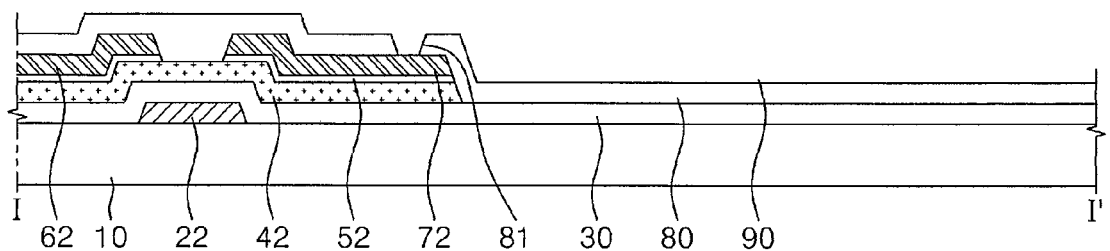
Figure 8F:
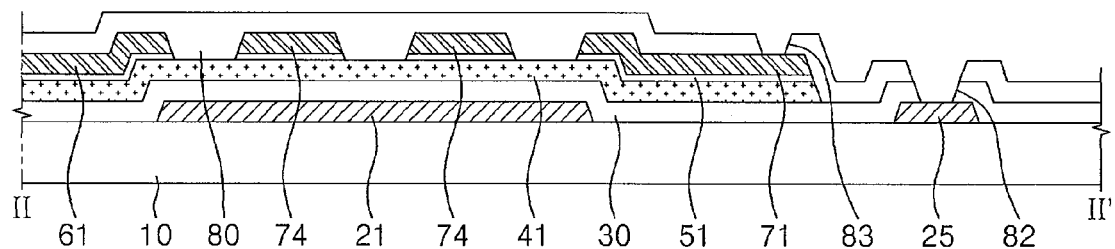

FIG. 8F is a cross-sectional view illustrating a third mask process of the method of manufacturing the TFT substrate in accordance with the present invention.

A passivation layer 80 including a pixel contact hole 81, first and second contact holes 82 and 83, and a data pad contact hole 86 is formed through the third mask process.

The passivation layer 80 may be formed through a PECVD process, a spin coating process, a spinless coating process, or the like as shown in FIG. 8F. The passivation layer 80 may include an inorganic insulating material such as the gate insulating layer 30 formed through a CVD or PECVD process. Moreover, the passivation layer 80 may include an organic insulating material such as acrylic organic compound, BCB, PFCB, and the like formed through a spin coating process, a spinless coating process, or the like. Furthermore, the passivation layer 80 may be formed in a double-layer structure in which the inorganic insulating material and the organic insulating material are stacked. Subsequently, a photoresist is applied on the passivation layer 80 and then a photoresist pattern is formed in an area where the passivation layer 80 is to be formed. Next, a pixel contact hole 81 passing through the passivation layer 80 to expose the second drain electrode 72 of the pixel TFT 120 is formed, and first and second contact holes 82 and 83 exposing the first drain electrode 71 or the first source electrode 61 of the protection TFT 110, and the discharge line 25 are formed through an etching process using the photoresist pattern.

Figure 8G:
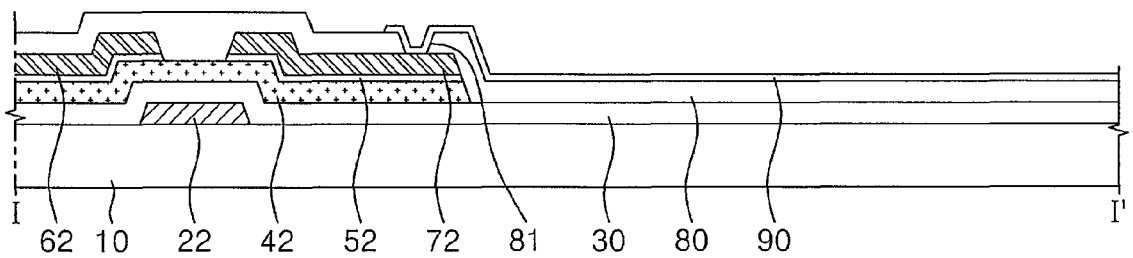
Figure 8G:
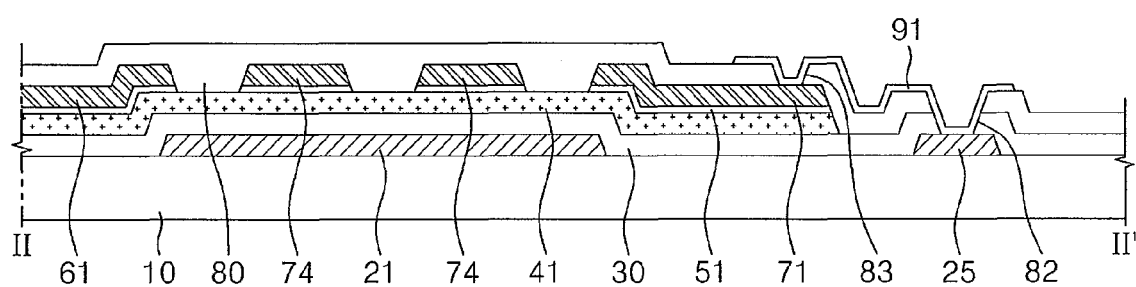

FIG. 8G is a cross-sectional view illustrating a fourth mask process of the method of manufacturing the TFT substrate in accordance with the present invention.

A pixel electrode 90, a gate pad 93, a data pad 92 and a bridge electrode 91 are formed through a fourth mask process.

IA third conductive layer is formed on the substrate 10, on which the passivation layer 80 is formed, through a deposition process such as sputtering. The third conductive layer may be formed of indium tin oxide (ITO), tin oxide (TO), indium zinc oxide (IZO), and the like. Subsequently, a photoresist is applied on the third conductive layer and then the pixel electrode 90, the gate pad 93, the data pad 92, and the bridge electrode 91 are formed by patterning the third conductive layer through the fourth mask process. The bridge electrode 91 connects the protection TFT 110 with a signal line or the discharge line 25 through the first and second contact holes 82 and 83. The pixel electrode 90 is electrically connected to the second drain electrode 72 through the pixel contact hole 81.

As described above, the TFT substrate and the method of manufacturing the same according to embodiments of the present invention form the protection TFTs of the ESD protection circuit and the pixel TFTs using the mask including the single slit during the formation of the data pattern, thus reducing the manufacturing cost of the mask.

Moreover, the TFT substrate and the method of manufacturing the same according to the present invention reduce the channel length L based on the drain current characteristics the same as the slit mask used in the related art pixel TFTs, thus reducing the size of the pixel TFT and improving the aperture ratio.

Furthermore, the channel area of the protection TFT is formed greater than the channel area of the pixel TFT by an integer number of times so that the protection TFT may be driven to bypass the static electricity to the discharge line only if static electricity is applied, whereas, if a normal signal or a test signal is applied, the protection TFT may not be driven.

In addition, it is possible to prevent static electricity discharge from the test pad by connecting the ESD protection circuit to the test line.

Additionally, it is possible to reduce the size of the ASG by forming the TFTs in the ASG in high density by using the single slit mask. It is further possible to protect the ASG from static electricity with the ESD protection circuit provided between the signal supply pad of the ASG and the discharge line for bypassing the static electricity introduced to the ASG to the discharge line.

Although exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A thin film transistor substrate comprising:
a signal line and a discharge line formed on a substrate;
a signal supply pad formed on one end of the signal line to supply a signal to the signal line; and
an electrostatic discharge protection circuit including a plurality of protection thin film transistors formed between the signal supply pad and the discharge line and/or between the signal line and the discharge line, the protection thin film transistors being connected in series,
wherein each of the protection thin film transistors comprises:
a first gate electrode;
a gate insulating layer covering the first gate electrode;
a first semiconductor layer and a first ohmic contact layer formed on the gate insulating layer, wherein the first semiconductor layer and a first ohmic contact layer overlap the first gate electrode;
a first source electrode and a first drain electrode formed facing each other on the first ohmic contact layer;
wherein the first source electrode of one of the protection thin film transistors is electrically connected to the first drain electrode of the adjacent protection thin film transistor, and
the first source electrode of one of the protection thin film transistors and the first drain electrode of the adjacent protection thin film transistor are floated.

2. The thin film transistor substrate of claim 1, wherein the signal line comprises:
a gate line supplying a gate-on voltage and a gate-off voltage; and
a data line supplying a data voltage, wherein the data line is insulated from the gate line.

3. The thin film transistor substrate of claim 2, further comprising:
a pixel thin film transistor electrically connected to the gate line and the data line; and
a pixel electrode connected to the pixel thin film transistor.

4. The thin film transistor substrate of claim 3, wherein the pixel thin film transistor comprises:
a second gate electrode connected to the gate line;
the gate insulating layer covering the second gate electrode;
a second source electrode connected to the data line;
a second drain electrode formed facing the second source electrode;
a second semiconductor layer formed between the second source electrode, the second drain electrode and the gate insulating layer, to form a second channel; and
a second ohmic contact layer formed between the second semiconductor layer and the second source electrode, and between the second semiconductor layer and the second drain electrode.

5. The thin film transistor substrate of claim 4, wherein the sum of lengths of channels formed in the protection thin film transistors is greater than a channel length of the pixel thin film transistor.

6. The thin film transistor substrate of claim 2, further comprising a gate driving unit integrated into the substrate to provide the gate-on voltage and the gate-off voltage to the gate line, wherein the signal supply pad provides a driving signal to the gate driving unit, the discharge line is formed between the signal supply pad and the gate driving unit, and the electrostatic discharge protection circuit is formed between the signal supply pad and the discharge line.

7. The thin film transistor substrate of claim 1, wherein the discharge line comprises one of a storage signal supply line receiving a storage voltage and a floating line.

8. The thin film transistor substrate of claim 1, wherein the discharge line comprises a test line receiving a test signal for testing the signal line.

* * * * *